(12) United States Patent
Fu

(10) Patent No.: US 7,323,027 B1
(45) Date of Patent: Jan. 29, 2008

(54) FAN FIXTURE AND HOUSING ASSEMBLY CONTAINING THE FAN FIXTURE

(75) Inventor: Tung-Cheng Fu, Taipei (TW)

(73) Assignee: Giga-Byte Technology Co., Ltd., Taipei (TW)

( * ) Notice: Subject to any disclaimer, the term of this patent is extended or adjusted under 35 U.S.C. 154(b) by 0 days.

(21) Appl. No.: 11/450,304

(22) Filed: Jun. 12, 2006

(51) Int. Cl.
B01D 50/00 (2006.01)

(52) U.S. Cl. .................. 55/385.6; 55/481; 55/506; 55/467; 55/471; 55/DIG. 31

(58) Field of Classification Search ............. 55/385.6, 55/481, 506, 467, 471, DIG. 31
See application file for complete search history.

(56) References Cited

U.S. PATENT DOCUMENTS

| | | | |
|---|---|---|---|
| 4,751,872 A | | 6/1988 | Lawson, Jr. |
| 4,889,542 A | * | 12/1989 | Hayes ................... 95/285 |
| 5,163,870 A | * | 11/1992 | Cooper ................. 454/184 |
| 5,223,006 A | * | 6/1993 | Moran, III ............... 96/18 |
| 5,766,285 A | * | 6/1998 | Killman ................ 55/385.6 |
| 5,888,134 A | * | 3/1999 | McNair, Jr. ............ 454/184 |
| 5,935,282 A | * | 8/1999 | Lin ..................... 55/385.6 |
| 6,110,245 A | * | 8/2000 | Schlag et al. .......... 55/385.6 |
| 6,174,231 B1 | * | 1/2001 | Bodin .................. 454/184 |
| 6,185,097 B1 | | 2/2001 | Behl |
| 6,297,950 B1 | | 10/2001 | Erwin |
| 6,309,437 B1 | * | 10/2001 | Jones ................... 55/385.1 |
| 6,767,379 B2 | * | 7/2004 | Jones ................... 55/385.6 |
| 6,776,706 B2 | * | 8/2004 | Kipka et al. ............ 454/184 |
| 6,797,044 B2 | * | 9/2004 | Ou Yang et al. ........... 96/224 |

FOREIGN PATENT DOCUMENTS

JP 05261227 A * 10/1993

* cited by examiner

Primary Examiner—Duane Smith
Assistant Examiner—Sonji Turner
(74) Attorney, Agent, or Firm—Rosenberg, Klein & Lee

(57) ABSTRACT

A fan fixture includes a base having a chamber to receive a fan, the chamber of the base having two adjacent side faces formed with a slot and an air inlet respectively, a cover detachably mounted on the base to fix the fan in the chamber of the base and having a plurality of air outlets, and a filter net inserted through the slot into the chamber of the base to cover the air inlet of the base. Thus, the filter net of the fan fixture covers the air inlet of the base to provide a dustproof effect so as to prevent the dust or insects from entering the fan to protect the fan and the electronic parts contained in the housing.

2 Claims, 5 Drawing Sheets

FAN FIXTURE AND HOUSING ASSEMBLY CONTAINING THE FAN FIXTURE

BACKGROUND OF THE INVENTION

1. Field of the Invention

The present invention relates to a fan fixture, and more particularly to a fan fixture for a housing assembly of a computer.

2. Description of the Related Art

A conventional housing assembly of a computer comprises a housing, a plurality of electronic parts mounted in the housing, and a fan mounted in a side wall of the housing to introduce ambient air from the vent holes in the side wall of the housing into the inside of the housing to provide a heat dissipation effect to the electronic parts contained in the housing. However, the housing is not provided with a cover to cover the vent holes of the housing, so that the dust or insects will easily enter the inside of the housing by the attractive force of the fan to break the electronic parts contained in the housing, thereby decreasing the working efficiency and lifetime of the electronic parts.

A conventional filter device for the housing assembly of a computer is disclosed in the Taiwan Utility Model Patent No. 274558, Taiwan Utility Model Publication No. 381742, China Utility Model Patent No. 200320119076.3, and U.S. Pat. Nos. 4,751,872 and 6,297,950. However, the above-mentioned conventional filter device has a complicated construction and cannot be mounted on the housing easily and conveniently, thereby causing inconvenience to a user in assembly, replacement and maintenance of the conventional filter device.

SUMMARY OF THE INVENTION

The primary objective of the present invention is to provide a fan fixture and a housing assembly containing the fan fixture.

Another objective of the present invention is to provide a fan fixture, wherein the snapping hooks of the cover are detachably snapped into the slots of the frame so that the cover can be mounted on and detached from the frame easily and rapidly, thereby greatly facilitating a user mounting and detaching the fan.

A further objective of the present invention is to provide a fan fixture, wherein the filter of the fan fixture covers the air inlet of the frame to provide a dustproof effect so as to prevent the dust or insects from entering the fan to protect the fan and the electronic parts contained in the housing.

A further objective of the present invention is to provide a fan fixture, wherein the filter is detachably mounted on the top cover and the frame, so that the filter can be directly removed from the top cover to facilitate the user cleaning the filter.

A further objective of the present invention is to provide a fan fixture, wherein the two opposite protruding wings of the filter net cover the receiving hole of the top cover to prevent the dust or insects from entering the receiving hole of the top cover.

In accordance with the present invention, there is provided a fan fixture, comprising:

a fan;

a frame having a chamber to receive the fan and an air inlet in communication with the chamber;

a cover comprising a plurality of air outlets defined therein, wherein the fan is disposed in the cover and the cover is detachably mounted on the frame so that a gap is defined between the cover and the frame; and a filter inserted into the gap to cover the air inlet of the frame.

Further benefits and advantages of the present invention will become apparent after a careful reading of the detailed description with appropriate reference to the accompanying drawings.

DETAILED DESCRIPTION OF THE INVENTION

Figures 1, 2:
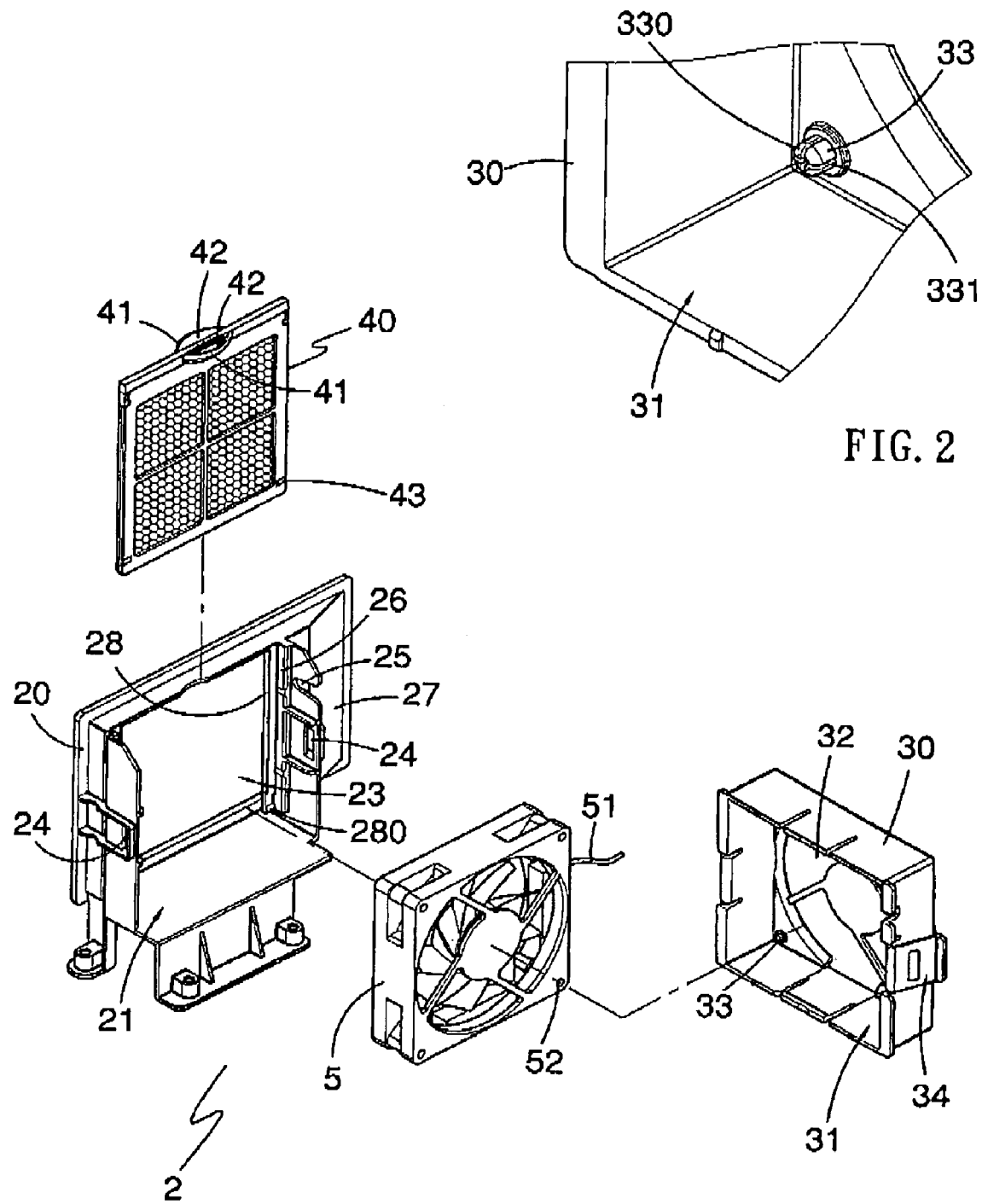
FIG. 1 is an exploded perspective view of a fan fixture in accordance with the preferred embodiment of the present invention.
FIG. 2 is a partially enlarged perspective view of a cover of the fan fixture as shown in FIG. 1.

Referring to the drawings and initially to FIGS. 1 and 2, a fan fixture 2 in accordance with the preferred embodiment of the present invention comprises a frame 20, a cover 30, and a filter 40.

The frame 20 has a chamber 21 to receive a fan 5 which has an electric wire 51 and a plurality of holes 52. The frame 20 includes an air inlet 23 in communication with the chamber 21. Thus, the fan 5 introduces ambient air from the air inlet 23 into the chamber 21 of the frame 20. The chamber 21 of the frame 20 is defined between two opposite side walls each formed with a slot 24, and one of the two opposite side walls of the chamber 21 of the frame 20 has a breach 25 to allow passage of the electric wire 51 of the fan 5.

The cover 30 is disposed in the chamber 21 of the frame 20 and has a receiving space 31 to receive a fan 5. The receiving space 31 of the cover 30 has a bottom face having a central portion formed with a plurality of air outlets 32 to vent the air and four corners each provided with a post 33. The fan 5 is disposed in the cover 30 while the posts 33 of the cover 30 are inserted into the holes 52 of the fan 5 so that the fan 5 is retained in the cover 30. Each of the posts 33 of the cover 30 has a distal end formed with a chamfered guide portion 330 for smooth insertion into a related one of the holes 52 of the fan 5 and has a periphery formed with a plurality of axially extending slits 331 for increasing the flexibility thereof. The cover 30 has two opposite side walls each formed with a flexible snapping hook 34 detachably snapped into a related one of the slots 24 of the frame 20 so that the cover 30 is detachably mounted on the frame 20. Accordingly, the cover 30 can be mounted on and detached from the frame 20 easily and rapidly through the snapping hooks 34 and the slots 24, thereby greatly facilitating a user mounting and detaching the fan 5. The cover 30 is attached to the frame 20 so that a gap 260 is defined between the cover 30 and the frame 20, between the side walls of the chamber 21.

Figure 4:
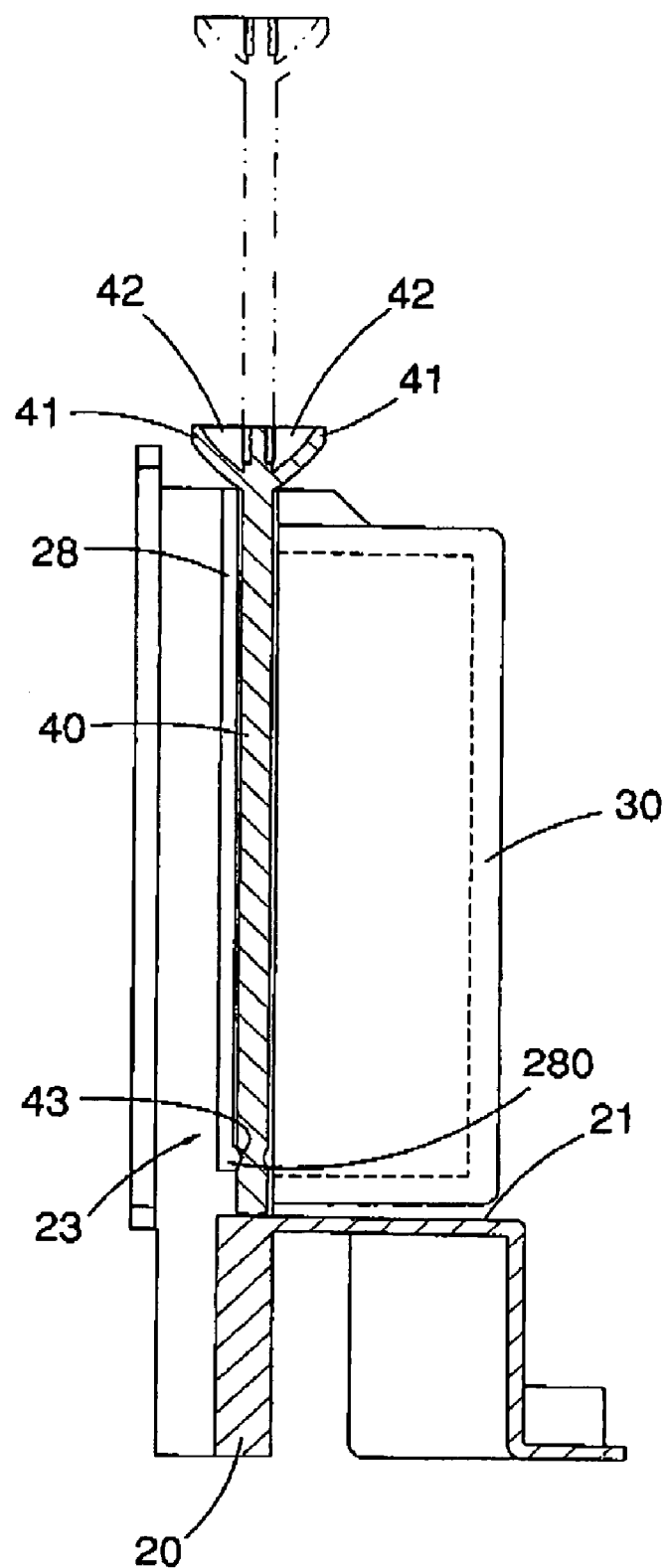
FIG. 4 is a side plan cross-sectional assembly view of the fan fixture as shown in FIG. 1.

The filter 40 is inserted into the gap 260 and located between the frame 20 and the fan 5 to cover the air inlet 23 of the frame 20. The filter 40 has an upper end provided with two opposite protruding wings 41 each having a depression 42 to facilitate a user's one finger gripping the filter 40. Each of the wings 41 is substantially arc-shaped and extends outwardly and upwardly from the filter 40 in an oblique manner as shown in FIG. 4.

Figure 3:
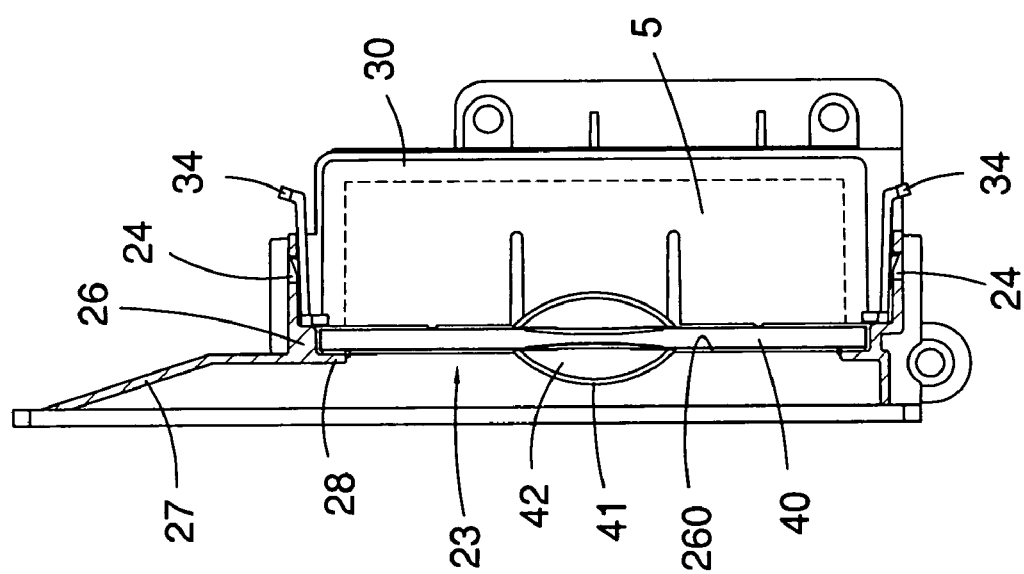
FIG. 3 is a top plan cross-sectional assembly view of the fan fixture as shown in FIG. 1.

Referring to FIGS. 1-3, each of the side walls of the chamber 21 of the frame 20 is formed with a flange 26 located adjacent to the air inlet 23 and rested on the cover 30. The fan 5 and the frame 20 are separated by the flange 26 so that the gap 260 is defined between the fan 5 and the frame 20 to receive the filter 40. The air inlet 23 of the frame 20 has a side provided with an air guide plate 27 extending outwardly in an oblique manner, so that the fan 5 can introduce more air.

Referring to FIGS. 1-4, the air inlet 23 of the frame 20 has two opposite sides each formed with a protruding resting edge 28 rested on the filter 40. The filter 40 has a lower end formed with two positioning grooves 43. The resting edge 28 of the air inlet 23 of the frame 20 has a lower end formed with a positioning protrusion 280 detachably positioned in the respective positioning groove 43 of the filter 40 so that the filter 40 is positioned on the frame 20 rigidly and stably.

Referring to FIGS. 1-5, a housing assembly for a computer in accordance with the preferred embodiment of the present invention comprises a housing 1, a top cover 11, and the fan fixture 2.

The housing 1 has a side face 10 formed with a plurality of vent holes 13 connected to an inside of the housing 1.

The top cover 11 is mounted on the housing 1 and has a slot 14 located adjacent to the vent holes 13 of the housing 1. The slot 14 of the top cover 11 has a mediate portion formed with a hole 15 having a width greater than that of the slot 14 of the top cover 11.

The frame 20 of the fan fixture 2 is mounted in the housing 1. The air inlet 23 of the frame 20 faces the vent holes 13 of the housing 1, so that the fan 5 introduces ambient air from the vent holes 13 of the housing 1 and the air inlet 23 of the frame 20 into the housing 1. The filter 40 of the fan fixture 2 is inserted into the gap 260 through the slot 14 of the top cover 11 to cover the air inlet 23 of the frame 20.

Figure 5:
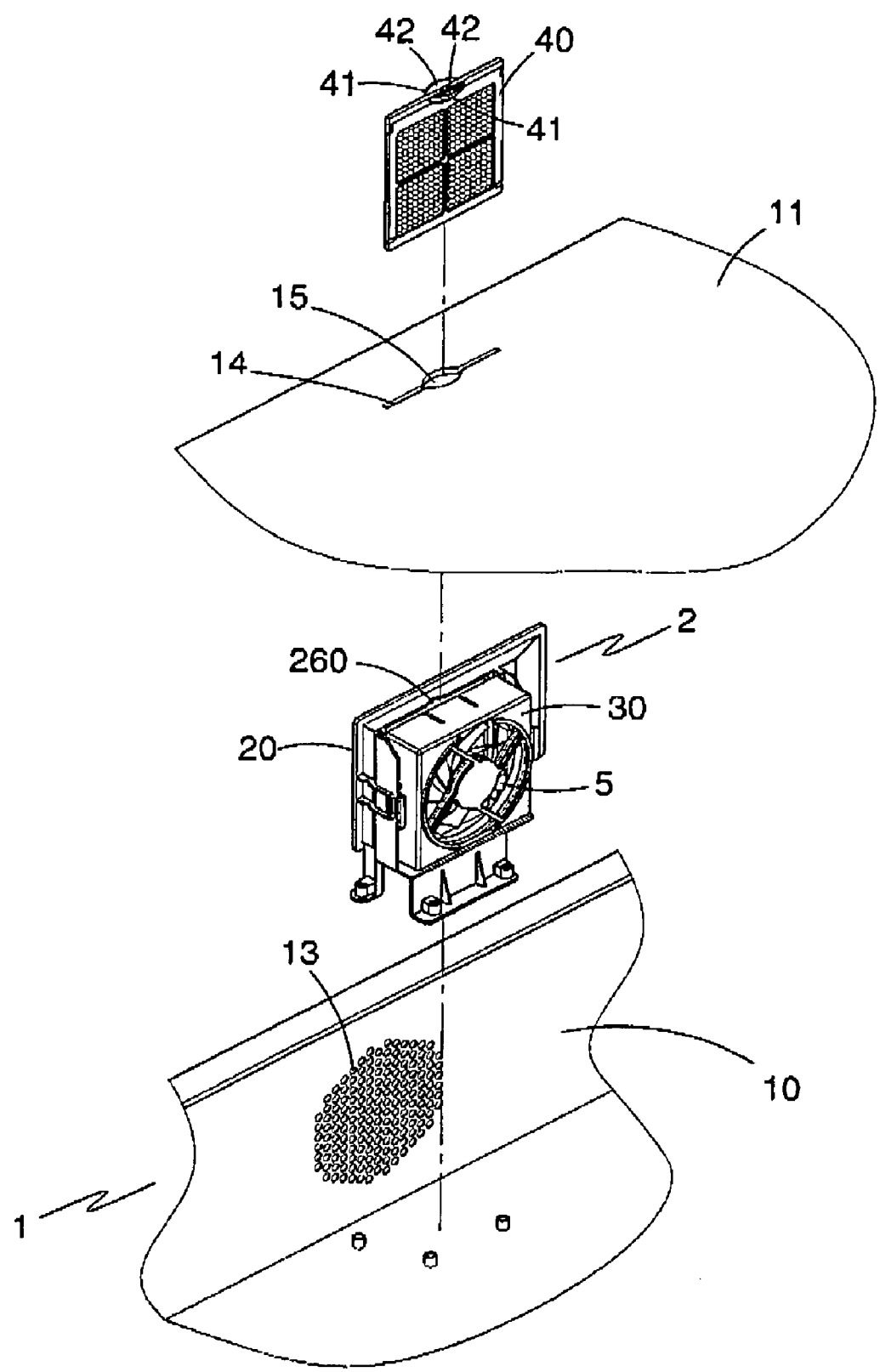
FIG. 5 is an exploded perspective view of a housing assembly in accordance with the preferred embodiment of the present invention.
Figure 6:
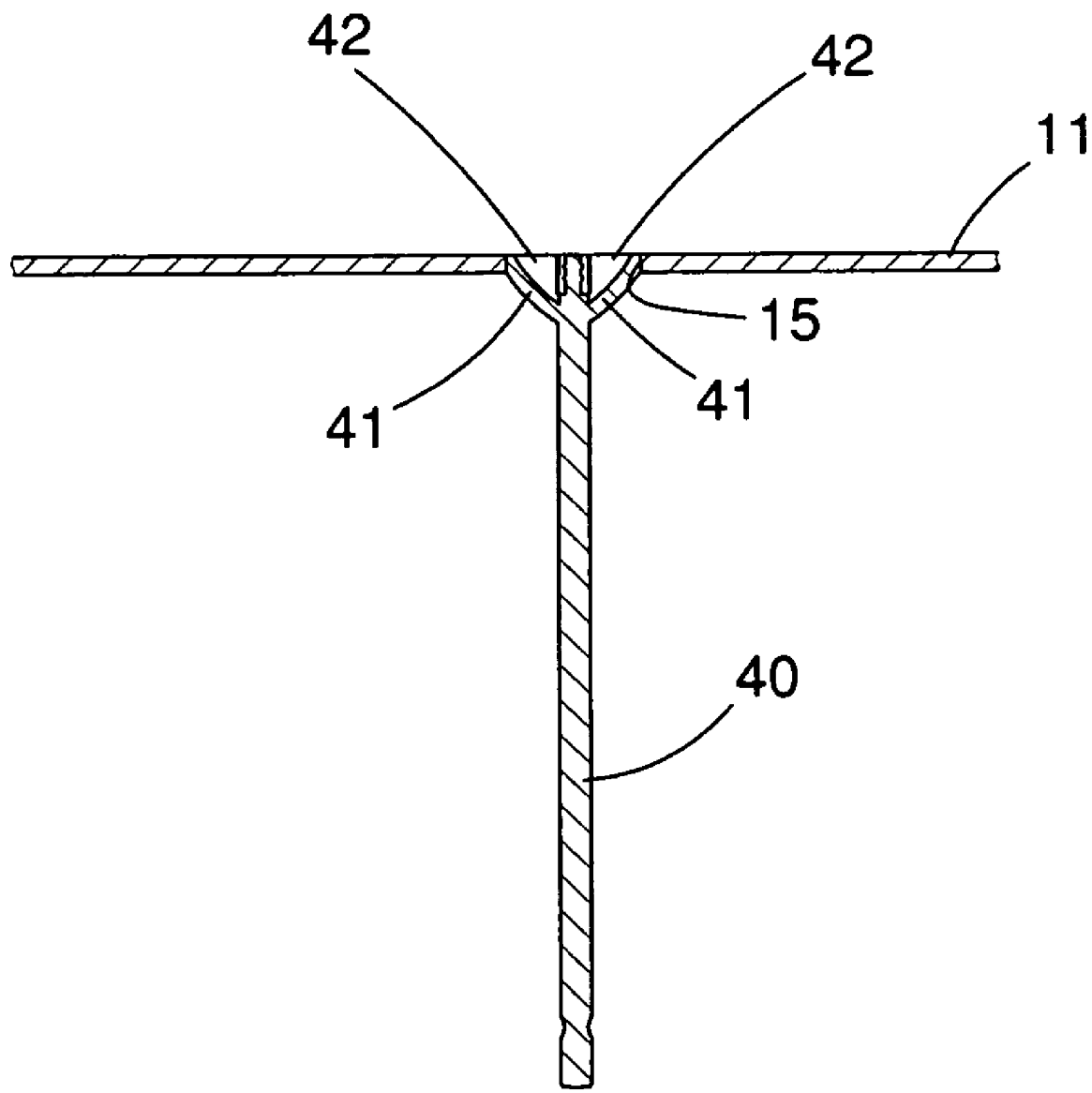
FIG. 6 is a partially side plan cross-sectional assembly view of the housing assembly as shown in FIG. 5.

Referring to FIGS. 5 and 6, when the filter 40 of the fan fixture 2 is inserted into the gap 260 through the slot 14 of the top cover 11, the wings 41 of the filter 40 cover the hole 15 of the top cover 11 to prevent the dust from entering the hole 15 of the top cover 11.

Accordingly, the snapping hooks 34 of the cover 30 are detachably snapped into the slots 24 of the frame 20 so that the cover 30 can be mounted on and detached from the frame 20 easily and rapidly, thereby greatly facilitating a user mounting and detaching the fan 5. In addition, the filter 40 of the fan fixture 2 covers the air inlet 23 of the frame 20 to provide a dustproof effect so as to prevent the dust or insects from entering the fan 5 to protect the fan 5 and the electronic parts contained in the housing 1. Further, the filter 40 is detachably mounted on the top cover 11 and the frame 20, so that the filter 40 can be directly removed from the top cover 11 to facilitate the user cleaning the filter 40. Further, the two opposite protruding wings 41 of the filter 40 cover the hole 15 of the top cover 11 to prevent the dust or insects from entering the hole 15 of the top cover 11.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A fan fixture to be disposed in a computer device housing with a slot defined therein and a hole in communication with the slot, the fan fixture comprising:
   a fan comprising at least one hole defined therein;
   a cover comprising:
      a space for receiving the fan,
      at least one air outlet in communication with the space;
      at least one post comprising at least one slit for increasing the flexibility thereof so that the post can easily be inserted into the hole of the fan; and
      at least one snapping hook formed thereon;
   a frame comprising:
      a chamber for receiving the cover so that a gap is defined between the frame and the cover;
      at least one slot defined therein for receiving the snapping hook so that the cover is detachably attached to the frame; and
      an air inlet in communication with the chamber; and
   a filter comprising two opposite wings each comprising a depression defined therein so that a user can insert two fingers in the depressions and easily pinch a portion of the filter between the wings, wherein the wings cover the hole of the housing to protect the interior of the housing from contaminant when the filter is inserted in the gap through the slot of the housing to cover the air inlet of the frame and therefore protect the fan from contaminant.

2. The fan fixture in accordance with claim 1, wherein the filter has a lower end formed with two positioning grooves, and the air inlet of the frame has two opposite sides each formed with a protruding resting edge which has a lower end formed with a positioning protrusion, wherein the positioning protrusions of the frame are positioned in the positioning grooves of the filter respectively when the filter is inserted in the gap to cover the air inlet.

* * * * *